United States Patent
Li et al.

(10) Patent No.: US 8,744,795 B2
(45) Date of Patent: Jun. 3, 2014

(54) ELECTRONIC DEVICE AND METHOD FOR CONTROLLING MODULATIONS OF MULTIPLE-INSTRUMENTS AND SENSORS

(75) Inventors: Shen-Chun Li, New Taipei (TW); Hsien-Chuan Liang, New Taipei (TW); Wen-Laing Tseng, New Taipei (TW); Yu-Chang Pai, New Taipei (TW); Shou-Kuo Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 381 days.

(21) Appl. No.: 13/195,853

(22) Filed: Aug. 2, 2011

(65) Prior Publication Data

US 2012/0095716 A1  Apr. 19, 2012

(30) Foreign Application Priority Data

Oct. 15, 2010  (TW) ................................ 99135344 A

(51) Int. Cl.
 *G06F 19/00* (2011.01)
 *G01R 31/36* (2006.01)
(52) U.S. Cl.
 CPC ................................ *G01R 31/3627* (2013.01)
 USPC ........................................................ 702/116

(58) Field of Classification Search
 CPC .................................................... G01R 31/3627
 USPC ........................................................ 702/116, 65
 See application file for complete search history.

(56) References Cited

U.S. PATENT DOCUMENTS 3,502,944 A * 3/1970 Squiers ........................... 361/24
7,060,948 B2 * 6/2006 Cho et al. ...................... 219/497

* cited by examiner

*Primary Examiner* — Bryan Bui
(74) *Attorney, Agent, or Firm* — Novak Druce Connolly Bove + Quigg LLP

(57) ABSTRACT

A method for modulating multiple-instruments and multiple-sensors using an electronic device. The electronic device controls an instrument to measure the working parameters of an object, and controls a sensor to detect the working temperature of the object. By comparing the working parameters against a predefined range, and comparing the working temperature against a predefined temperature value, the electronic device determines whether the instrument and the sensor need to be modulated. If any of the working parameters is not within the predefined range or if the working temperature is greater than the predefined temperature value, the electronic device controls the instrument and the sensor to be modulated by using a modulation transfer function and a predetermined direction.

8 Claims, 4 Drawing Sheets

ELECTRONIC DEVICE AND METHOD FOR CONTROLLING MODULATIONS OF MULTIPLE-INSTRUMENTS AND SENSORS

BACKGROUND

1. Technical Field

Embodiments of the present disclosure generally relate to electronic devices and methods for managing instruments and sensors, particularly to an electronic device and method for controlling modulations of multiple-instruments and sensors.

2. Description of Related Art

Using a host computer to record data concerning an object measured by an instrument and a sensor is a common test method. After the recording, the host computer can determine whether the working parameters and working temperature of the object are normal by comparing the measurement data with predetermined values. In order to control an input current or an input voltage of the object, the instrument and the sensor may be modulated, however, modulating the instrument and sensor is a difficult problem.

DETAILED DESCRIPTION

In general, the data "module," as used herein, refers to logic embodied in hardware or firmware, or to a collection of software instructions, written in a programming language, such as, for example, Java, C, or assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules, and may be stored in any type of non-transitory readable computer-readable medium or other computer storage device. Some or all of the methods may alternatively be embodied in specialized hardware. Depending on the embodiment, the non-transitory readable medium may be a hard disk drive, a compact disc, a digital video disc, a tape drive or other suitable storage medium.

Figure 1:
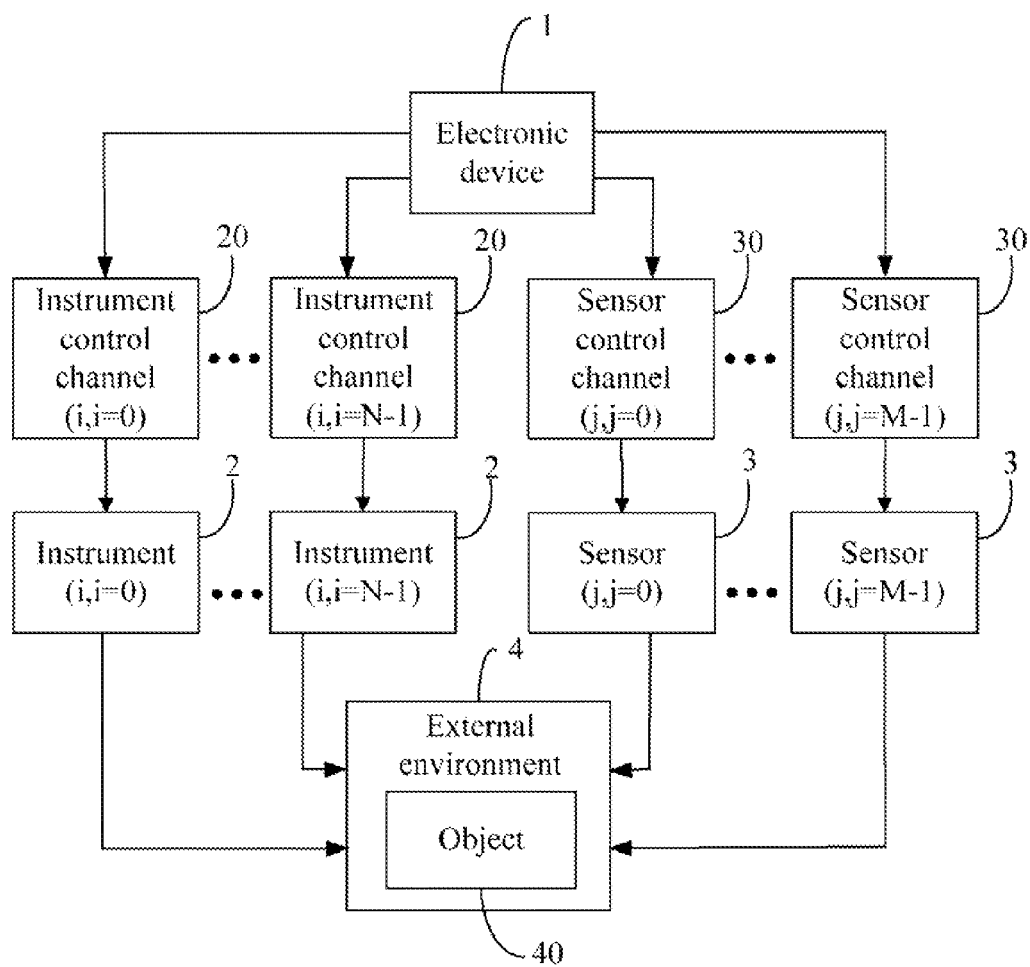
FIG. 1 is a block diagram of one embodiment of an electronic device communicating with an object via multiple-instruments and multiple-sensors.

FIG. 1 is a block diagram of one embodiment of an electronic device 1 communicating with an object 40 via multiple instruments 2 and multiple sensors 3. In the embodiment, each of the instruments 2 is connected to the electronic device 1 via an instrument control channel 20, and each of the sensors 3 is connected to the electronic device 1 via a sensor control channel 30. Each of the instruments 2 and sensors 3 has a serial number. As illustrated in FIG. 1, assuming that N numbers of instruments 2 and M numbers of sensors 3 are connected to the electronic device 1, the serial numbers "i" of the instruments 2 are equal to "0, 1, 2, . . . and N−1," and the serial numbers "j" of the sensors 3 are equal to "0, 1, 2, . . . and M−1".

In the embodiment, each of the instruments 2 is used for measuring working parameters of an object 40 included in an external environment 4. For example, the instrument 2 inputs an input current to the object 40, and then measures the output voltage of the object, to detect performance of the object 40. In the embodiment, the object 40 may be a battery, a capacitor, resistor, or other electronic component. The instruments 2 can be oscilloscopes for measuring voltage and current of the battery. Each of the sensors 3 is used for detecting working temperature of the object 40 when the object 40 is working normally. In the embodiment, the working temperature is a temperature of the object 40 when the object 40 is powered on, which may not be processing data.

Figure 2:
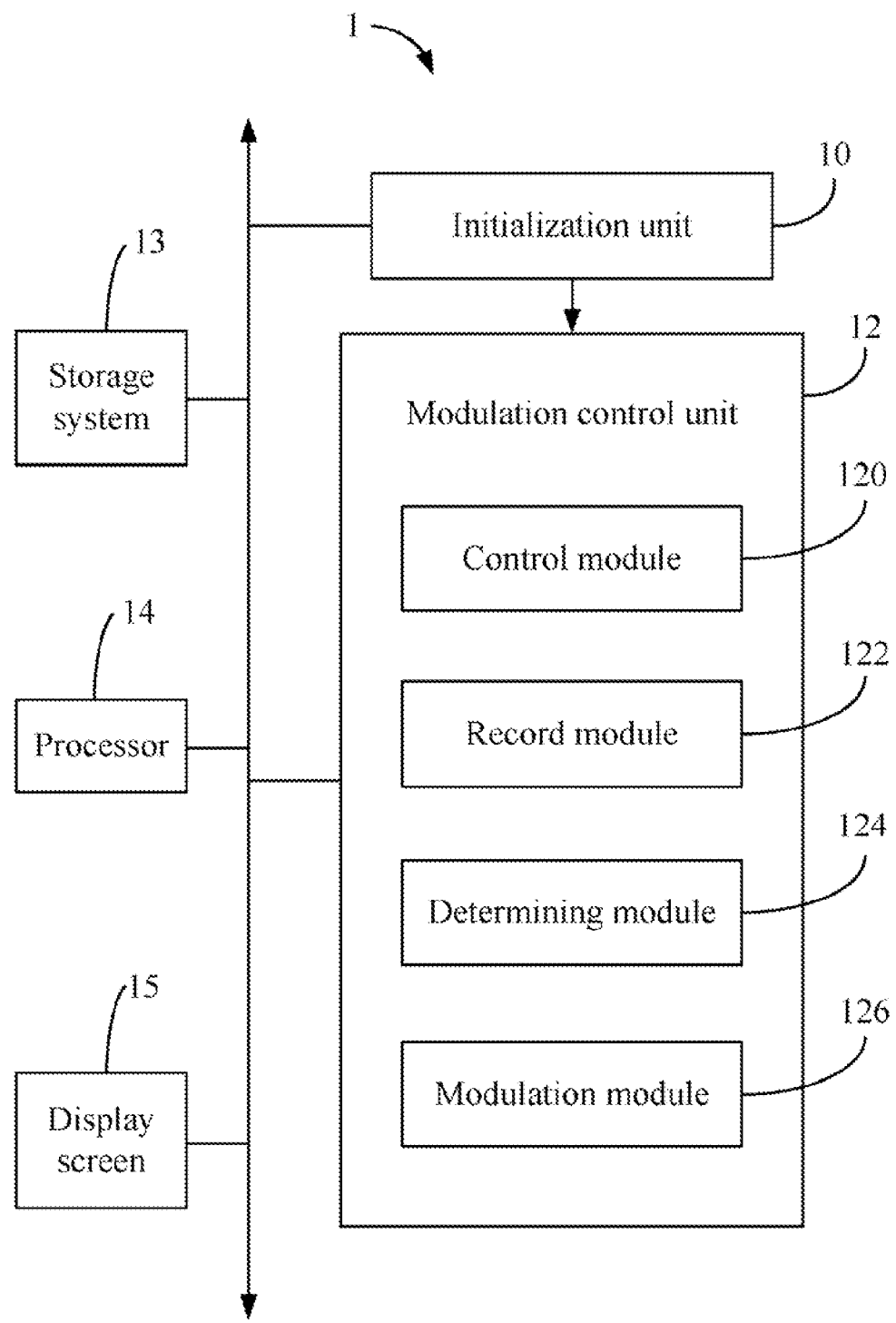
FIG. 2 is a block diagram of one embodiment of an electronic device including an initialization unit and a modulation control unit.

FIG. 2 is a block diagram of one embodiment of the electronic device 1 including an initialization unit 10 and a modulation control unit 12. In one embodiment, the electronic device 1 may be a computer, a server, a portable electronic device, or any other electronic device that includes a storage system 12, at least one processor 14 and a display screen 16. The modulation control unit 12 includes a control module 120, a record module 122, a determining module 124, and a modulation module 126. Each of the modules 120-126 and the initialization unit 10 may be software programs including one or more computerized instructions that are stored in the storage system 12 and executed by at least one processor 14, to modulate the instruments 2 and the sensors 3. The display screen 16 is used for displaying data related to the modulation, and displaying the modulation results, such as the working parameters or the working temperature after the modulation.

The initialization unit 10 is used for sending an initialization command to each of the instruments 2 and the sensors 3, and controlling each of the instruments 2 and the sensors 3 to be initialized.

Figure 3:
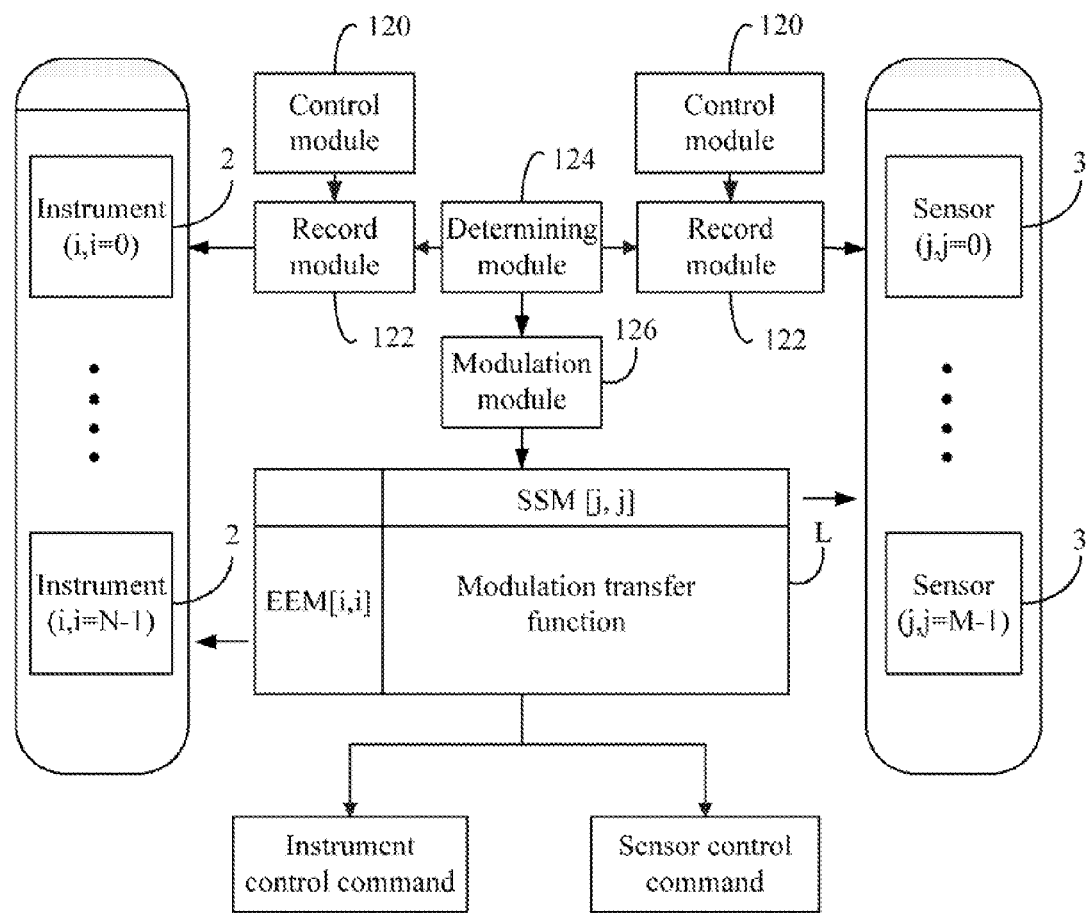
FIG. 3 is a block diagram of one embodiment of function modules of the modulation control unit of FIG. 1.

The control module 120 controls one or more instruments 2 to measure the working parameters of the object 40, and controls one or more sensors 3 to detect the working temperature of the object 40. FIG. 3 gives an example of the control module 120 controlling one of the instruments 2 to measure the working parameters of the object 40, and controls one of the sensors 3 to detect the working temperature of the object 40 as below.

The record module 122 records the working parameters of the object 40 measured by the instrument 2, and records the working temperature of the object 40 detected by the sensor 3.

The determining module 124 determines whether the instrument 2 or the sensor 3 needs to be modulated by comparing the working parameters against a predefined range of parameters, and by comparing the working temperature against predefined temperature values.

If any of the working parameters is not within the predefined range or the working temperature is greater than the predefined temperature value, the determining module 124 determines that the instrument 2 and the sensor 3 need to be modulated. The modulation module 126 modulates the determined instrument 2 and the determined sensor 3 by using a modulation transfer function "L" and a predetermined direction. The modulation transfer function "L" is shown in FIG. 3. The predetermined direction may include a unidirectional modulation and a bidirectional modulation.

In detail, the modulation transfer function "L" is a two-dimensional transfer function. The modulation transfer function "L" includes a first one-dimensional matrix EEM[i, i] and a second one-dimensional matrix SSM [j, j]. The first one-dimensional matrix EEM[i, i] is used for saving a function of the instruments 2 in a particular state, and the second one-dimensional matrix SSM [j, j] is used for saving a function of the sensors 3 in a particular state. Supposing that an operational matrix of the modulation transfer function "L" is [X][Y], EEM[i, i]=[A], and SSM [j, j]=[B], the computational formula of the modulation transfer function "L" is: [A]=[X][B] or [B]=[Y][A]. For example, if [A]=[1, 1], [Y]={[sin 45°, cons45°], [−cons45°, sin 45°]}, the state function [B] of the second one-dimensional matrix SSM [j, j] is equal to [sin 45°, −cons45°].

In one example, the predetermined direction is the unidirectional modulation, the modulation module 126 can use the first one-dimensional matrix EEM[i, i] to modulate the second one-dimensional matrix SSM [j, j], or use the second one-dimensional matrix SSM [j, j] to modulate the first one-dimensional matrix EEM[i, i]. As illustrated in FIG. 3, if the modulation module 126 uses the second one-dimensional matrix SSM [j, j] to modulate the first one-dimensional matrix EEM[i, i], the modulation module 126 can generate a instrument control command according to a computation formula [A]=[X][B] of the modulation transfer function, and modulate the instrument 2 according to the instrument control command. If the modulation module 126 uses the first one-dimensional matrix EEM[i, i] to modulate the second one-dimensional matrix SSM [j, j], the modulation module 126 can generate a sensor control command according to a computational formula [B]=[Y][A] of the modulation transfer function, and modulate the sensor 3 according to the sensor control command.

Figure 4:
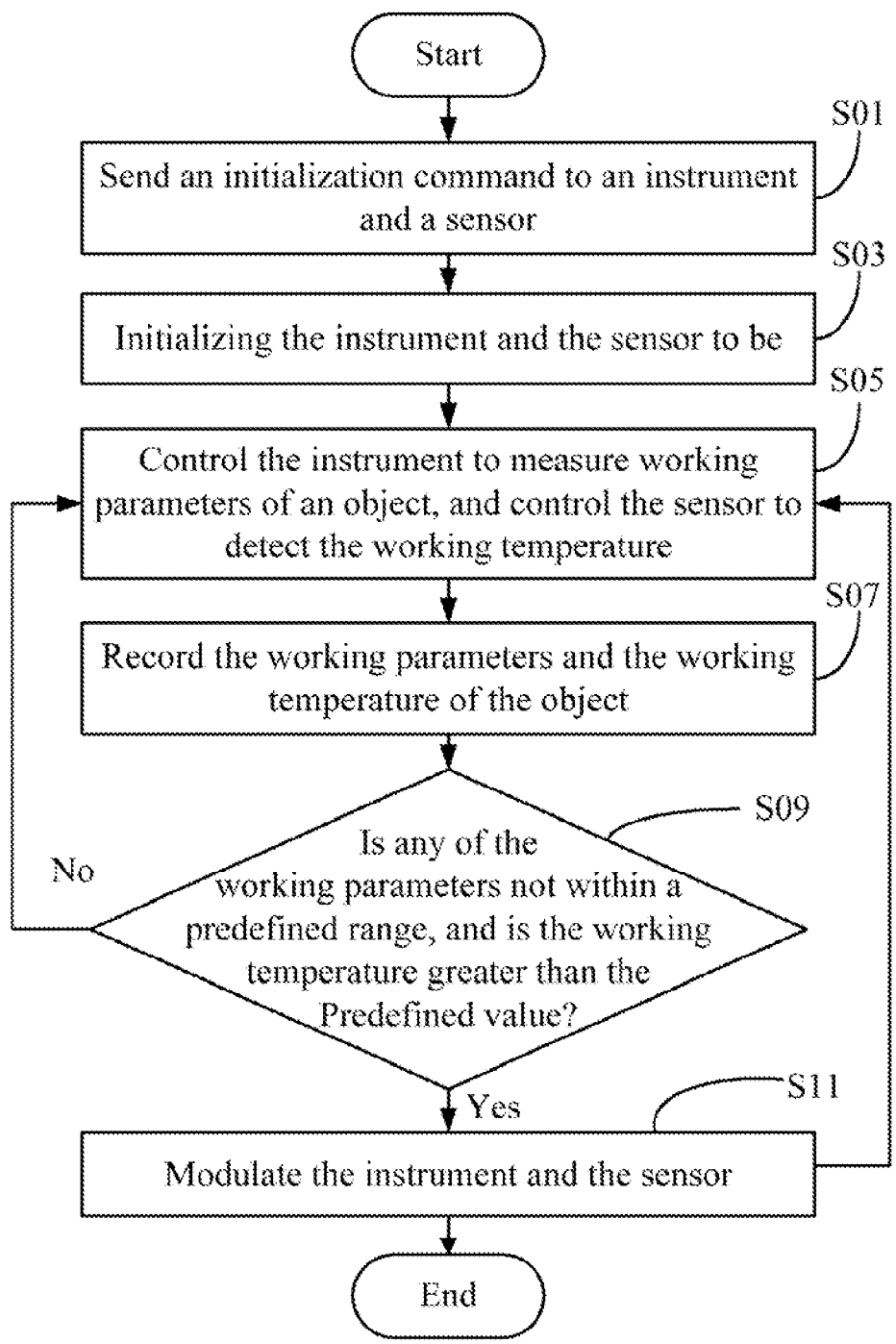
FIG. 4 is a flowchart illustrating one embodiment of a method for controlling the modulations of multiple-instruments and multiple-sensors.

FIG. 4 is a flowchart illustrating one embodiment of a method for modulating multiple-instruments and multiple-sensors. Depending on the embodiment, additional blocks may be added, others removed, and the ordering of the blocks may be changed. FIG. 4 gives an example of the control module 120 controlling one of the instruments 2 to measure the working parameters of the object 40, and controlling one of the sensors 3 to detect the working temperature of the object 40 as below.

In block S01, the initialization unit 10 sends initialization commands to the instrument 2 and the sensor 3.

In block S03, the initialization unit 10 initializes the instrument 2 and the sensor 3.

In block S05, the control module 120 controls the instrument 2 to measure the working parameters of the object 40, and controls the sensor 3 to detect a working temperature of the object 40 when the object 40 is working normally. In the embodiment, the object 40 may be a battery, a capacitor, resistor, or other electronic component.

In block S07, the record module 122 records the working parameters of the object 40 as measured by the instrument 2, and records the working temperature of the object 40 as detected by the sensor 3.

In block S09, the determining module 124 determines whether any of the working parameters is not within a predefined range, and whether the working temperature is greater than a predefined temperature value. If any of the working parameters is not within the predefined range, or if the working temperature is greater than the predefined temperature value, the determining module 124 determines that the instrument 2 and the sensor 3 need to be modulated, and block S11 is implemented. If all of the working parameters are within the predefined range, and the working temperature is not greater than the predefined temperature value, the determining module 124 determines that none of the instrument 2 and the sensor 3 need to be modulated, and the flow returns to block 505.

In block S11, the modulation module 126 modulates the instrument 2 and the sensor 3 by using a modulation transfer function "L" and a predetermined direction. The modulation transfer function "L" is shown in FIG. 3. The predetermined direction includes a unidirectional modulation and a bidirectional modulation.

For example, if the object 40 is a battery, the instrument 2 is an oscilloscope, and the sensor 3 is a temperature sensor, the modulation control unit 12 can perform reliability tests on the battery charging, or on the battery discharging. During a reliability test, the oscilloscope measures the voltage of the battery and the temperature sensor detects the environmental temperature around the battery (environment temperature). The record module 122 records the voltage and the environment temperature. By comparing the voltage against a predefined voltage, and comparing the environment temperature against a predefined temperature, the determining module 124 can determine whether the oscilloscope and the temperature sensor need to be modulated, so as to avoid an explosion or other consequence of over-voltage to the battery.

Although certain inventive embodiments of the present disclosure have been specifically described, the present disclosure is not to be construed as limited thereto. Various changes or modifications may be made to the present disclosure without departing from the scope and spirit of the present disclosure.

What is claimed is:

1. A method for controlling modulations of multiple-instruments and multiple-sensors using an electronic device, the method comprising:
    sending an initialization command to an instrument and a sensor;
    initializing the instrument and the sensor according to the initialization command;
    controlling the instrument to measure working parameters of an object, and controlling the sensor to detect a working temperature of the object;
    recording the working parameters and the working temperature of the object;
    determining whether the instrument and the sensor needs to be modulated by comparing the working parameters against a predefined range and comparing the working temperature against a predefined temperature value; and
    modulating the determined instrument and the determined sensor by using a modulation transfer function and a predetermined direction, upon the condition that any of the working parameters is not within the predefined range or the working temperature is greater than the predefined temperature value.

2. The method as described in claim 1, further comprising:
    controlling the modulated instrument and the modulated sensor to synchronously monitor the object, and obtaining the working parameters and the working temperature of the object.

3. The method as described in claim 1, wherein the predetermined direction comprises a unidirectional modulation and a bidirectional modulation.

4. An electronic device, comprising:
    at least one processor;
    a storage system; and
    one or more modules that are stored in the storage system and executed by the at least one processor, the one or more modules comprising:
    an initialization unit operable to send an initialization command to an instrument and a sensor, and initialize the instrument and the sensor according to the initialization command;

a control module operable to control the instrument to measure working parameters of an object, and control the sensor to detect working temperature of the object;

a record module operable to record the working parameters and the working temperature of the object;

a determining module operable to determine whether the instrument and the sensor needs to be modulated by comparing the working parameters against a predefined range and comparing the working temperature against a predefined temperature value; and a modulation module operable to modulate the determined instrument and the determined sensor by using a modulation transfer function and a predetermined direction, upon the condition that any of the working parameters is not within the predefined range or the working temperature is greater than the predefined temperature value.

5. The electronic device as described in claim 4, wherein the predetermined direction comprises a unidirectional modulation and a bidirectional modulation.

6. A non-transitory storage medium having stored thereon instructions that, when executed by a processor of an electronic device, causes the processor to perform a method for controlling modulations of multiple-instruments and multiple-sensors using an electronic device, the method comprising:

sending an initialization command to the instrument and the sensor;

initializing the instrument and the sensor according to the initialization command;

controlling the instrument to measure working parameters of an object, and controlling the sensor to detect working temperature of the object;

recording the working parameters and the working temperature of the object;

determining whether the instrument and the sensor needs to be modulated by comparing the working parameters against a predefined range and comparing the working temperature against a predefined temperature value; and modulating the determined instrument and the determined sensor by using a modulation transfer function and a predetermined direction, upon the condition that any of the working parameters is not within the predefined range or the working temperature is not the predefined temperature value.

7. The storage medium as described in claim 6, wherein the method further comprises:

controlling the modulated instrument and the modulated sensor to synchronously monitor the object, and obtaining the working parameters and the working temperature of the object.

8. The storage medium as described in claim 6, wherein the predetermined direction comprises a unidirectional modulation and a bidirectional modulation.

* * * * *